United States Patent [19]
Kim

[11] Patent Number: 5,525,539
[45] Date of Patent: Jun. 11, 1996

[54] METHOD FOR FORMING A LIGHT EMITTING DIODE FOR USE AS AN EFFICIENT EMITTER OR DETECTOR OF LIGHT AT A COMMON WAVELENGTH

[75] Inventor: James C. Kim, Westlake Village, Calif.

[73] Assignee: Opto Diode Corporation, Newbury Park, Calif.

[21] Appl. No.: 412,697

[22] Filed: Mar. 29, 1995

Related U.S. Application Data

[62] Division of Ser. No. 312,829, Sep. 27, 1994, Pat. No. 5,448,082.

[51] Int. Cl.$^6$ .................................................. H01L 21/208
[52] U.S. Cl. .......................... 437/119; 437/127; 437/128; 437/130; 117/57; 117/61
[58] Field of Search .................................. 437/107, 119, 437/128, 130, 127; 117/54, 57, 61; 148/DIG. 101; 257/101

[56] References Cited

U.S. PATENT DOCUMENTS

| | | | |
|---|---|---|---|
| 3,852,591 | 12/1974 | Lee et al. | 250/211 |
| 3,859,148 | 1/1975 | Dawson et al. | 148/172 |
| 4,032,370 | 6/1977 | Mataré | 148/171 |
| 4,202,000 | 5/1980 | Carballes | 357/19 |
| 4,606,780 | 8/1986 | Leibenzeder et al. | 148/171 |
| 4,968,642 | 11/1990 | Fujita et al. | 437/128 |
| 5,181,084 | 1/1993 | Bommer et al. | 257/101 |
| 5,445,897 | 8/1995 | Satoh et al. | 148/33.4 |

FOREIGN PATENT DOCUMENTS 0127393  7/1983  Japan ..................................... 437/128

OTHER PUBLICATIONS

Dawson, "High Efficiency Graded-Band-Gap $Ga_{1-x}Al_2As$ Light-Emitting Diodes", *Journal of Applied Physics*, vol. 48, No. 6 (1977), pp. 2485–2492.

*Primary Examiner*—R. Bruce Breneman
*Assistant Examiner*—Ramamohan Rao Paladugu
*Attorney, Agent, or Firm*—Koppel & Jacobs

[57] ABSTRACT

An infrared LED can function efficiently as both an emitter and a detector at a common wavelength without undesirable characteristics found in avalanche diodes. The LED comprises a graded-bandgap $Ga_{1-x}Al_xAs$ semiconductor material with two semiconductive regions that form a p-n junction. The value of x (the amount of aluminum in the semiconductive material $Ga_{1-x}Al_xAs$) is varied monotonically as the material is grown so that x decreases monotonically from a value greater than approximately 0.08 at the diode surface on the N side of the p-n junction to a value not less than zero at the diode surface on the P side of the junction. The value of x at the p-n junction is greater than 0 and less than approximately 0.08 as a result of a high initial growth temperature of at least about 930 degrees Celsius. A wavelength matched emitter and detector system is realized by adjusting the present diode's initial growth temperature so that its detector response curve substantially overlaps the emission curve of a second diode.

14 Claims, 5 Drawing Sheets

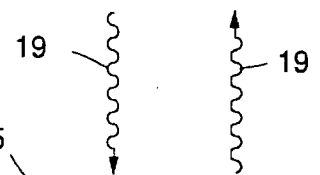
FIG. 1.
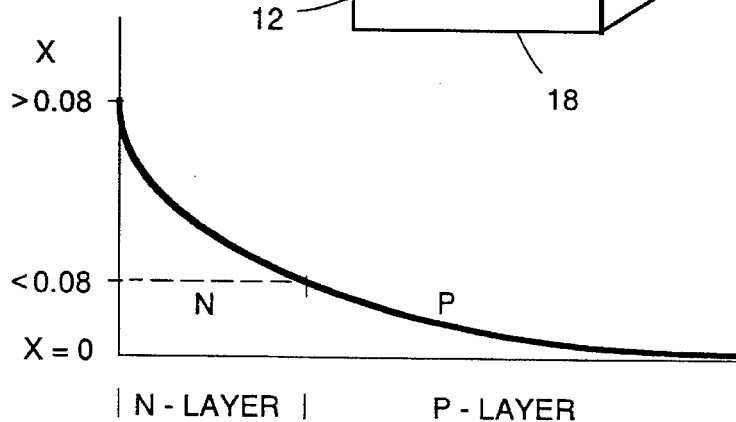
FIG. 2.
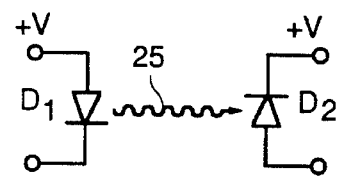
FIG. 4.
| TEMP.<br>COMPOSITION | 940° | 950° | 960° |
|---|---|---|---|
| $X_{Ga}$ | .930 | .924 | .918 |
| $X_{As}$ | .065 | .071 | .078 |
| $X_{Al}$ | .0026 | .0025 | .0025 |
| $X_{Si}$ | .0023 | .0023 | .0023 |
FIG. 7.

METHOD FOR FORMING A LIGHT EMITTING DIODE FOR USE AS AN EFFICIENT EMITTER OR DETECTOR OF LIGHT AT A COMMON WAVELENGTH

RELATED APPLICATION

This application is a divisional of application Ser. No. 08/312,829, filed on Sep. 27, 1994, now U.S. Pat. No. 5,448,082.

BACKGROUND OF THE INVENTION

1. Field of the Invention

The present invention relates to light emitting diodes (LEDs) and, more specifically, to an LED that is capable of functioning as an efficient emitter or detector of light at a common wavelength.

2. Description of the Related Art

LEDs are semiconductor photon sources that can serve as highly efficient electronic-to-photonic transducers. They are typically forward-biased p-n junctions fabricated from a direct-bandgap semiconductor material that emit light via injection electroluminescence. Their small size, high efficiency, high reliability, and compatibility with electronic systems make them very useful for such applications as lamp indicators; display devices; scanning, reading, and printing systems; fiber-optic communication systems; and optical data storage systems.

An LED can emit light efficiently only if the photon energy ($E_{hv}$) of the light is substantially less than the bandgap energy ($E_g$) of the material through which the photons must pass (typically the semiconductor material on each side of the p-n junction). This condition results in low absorption of the emitted photons as they propagate through the semiconductive material. Direct-band-gap LEDs are typically manufactured using standard liquid-phase epitaxy (LPE) techniques in which successive layers of p-doped and n-doped semiconductor material layers are grown on a substrate.

An efficient LED is the graded-bandgap LED described in L. Ralph Dawson, "High Efficiency Graded-Band-Gap $Ga_{1-x}Al_xAs$ Light-Emitting Diodes", *Journal of Applied Physics*, vol. 48, No. 6 (1977), pp. 2485–2492. This LED utilizes a graded-bandgap structure in which $E_g$ decreases monotonically from a high value on one side of the semiconductive material to a low value on the opposite side. The graded-bandgap structure causes the LED to emit light in the direction of increasing $E_g$ and results in higher emission efficiencies than can be achieved with conventional LEDs. Graded-bandgap LEDs are typically implemented with a single epitaxial layer, rather than multiple successive layers. As a result, they are simpler and less expensive to produce than conventional direct-band-gap LEDs.

An LED can be utilized as a light detector by applying a reverse biased voltage to it. When an LED is reverse biased, photons that are absorbed by the semiconductive LED material generate electron-hole pairs which in turn generate an electric current. The magnitude of the electric current is proportional to the amount of light impinging on the LED (the number of photons) and on the percentage of those photons that are absorbed by the LED (the absorption cross-section). For an LED to be an efficient photon absorber, the bandgap energy of the semiconductive material must be significantly less than the photon energy of the incident light. Otherwise, a majority of the photons will pass through the LED material without being absorbed.

It would be very useful to have an LED that is capable of functioning efficiently as both an emitter and a detector of light at a common wavelength. With such an LED, for example, the user of an optical system that includes both emitters and detectors operating at a common wavelength would only have to stock one type of LED. However, when one compares the bandgap energy requirements of an LED that is used as an emitter with the requirements of one used as a detector, it is apparent that the light emitting and light detecting functions require opposing bandgap energy requirements. Generally, LEDs that are efficient emitters of light at a given wavelength are low efficiency detectors of light of the same wavelength. As a result, a single LED is generally not capable of functioning alternately as an emitter and a detector of light at a common wavelength.

One prior LED, described in U.S. Pat. No. 4,202,000 by Jean-Claude Carballes, exhibits efficient performance as both an emitter and detector of light at a common wavelength by operating in an "avalanche" mode. When a diode is operating in an avalanche mode, a free electron that is generated by photon absorption is accelerated by a strong reverse-biased electric field to an energy greater than $E_g$. As a result, the accelerated electron itself can generated additional electron-hole pairs by impact ionization. The second electron is also accelerated under the effect of the electric field, and it may also be a source of further impact ionization. The process "avalanches", resulting in a multiplication of the number of electrons generated by the absorbed photon.

Although the avalanche phenomenon utilized by the Carballes LED (when operating as a detector) compensates for its low absorption cross-section, it suffers from several undesirable characteristics. First, diodes that utilize avalanching generally have longer response times than those that do not. This is because additional time is required for the electrons to cause impact ionizations.

Second, the amplification process is inherently random because each detected photon generates a random number of electrons (the number of electrons generated is a function of the number of impact ionizations that take place). As a result, the current generated by the diode has a random component that fluctuates above and below an average value. These random fluctuations in the current are a source of noise.

Third, the avalanche phenomenon can be unstable because it only occurs in the presence of a high reverse-biased electric field (near the breakdown field) in the active region. The strength of the electric field in the active region can be influenced by the amount of doping and the thickness of the active region. Therefore, any localized variations in the thickness or doping can result in variations in the electric field, which in turn can result in localized uncontrolled avalanches.

In addition, the Carballes LED is manufactured by growing three separate semiconductive epitaxial layers on a GaAs substrate. After each epitaxial layer is grown, the liquid composition of the growth solution must be changed by either vapor doping or by bringing the GaAs substrate into contact with a second solution. This multi-step growth technique is more complicated and costly than the single-step growth technique of Dawson, described above.

SUMMARY OF THE INVENTION

The present invention provides an infrared LED that can function efficiently as both an emitter and a detector of light at a common wavelength, without the undesirable characteristics found in avalanche diodes, and a fabrication method for the new LED.

The LED comprises a graded-bandgap $Ga_{1-x}Al_xAs$ semiconductor material with two semiconductive regions of opposite conductivity type that form a p-n junction. The value of x (the amount of aluminum in the semiconductive material $Ga_{1-x}Al_xAs$) is varied monotonically as the material is grown so that x decreases monotonically from a value greater than approximately 0.08 at the diode surface on the N side of the p-n junction to a value not less than zero at the diode surface on the P side of the junction. The value of x at the p-n junction is greater than 0 and less than approximately 0.08.

The LED is grown using a single-step liquid-phase epitaxy (LPE) technique. A melt of Ga, Si, Al and polycrystalline GaAs is brought to an initial growth temperature of at least 930 degrees Celsius. A GaAs substrate is brought into contact with the melt and then cooled at a rate of approximately 0.4 degrees Celsius per minute. The GaAs substrate is then removed from the first-to-grow side of the diode, which is used as the emitter or detector window.

The resulting diode has a graded-bandgap and can function efficiently as either an emitter or a detector. As the initial growth temperature is increased beyond 930 degrees Celsius, the diode's peak emission wavelength approaches its peak detector response wavelength. As a result, the efficiency of the diode as an emitter and a detector at a common wavelength goes up as the initial growth temperature is increased.

A wavelength matched emitter and detector system that uses one diode as an emitter and another diode as a detector can be fabricated by adjusting the initial growth temperature so that the first diode's emission curve substantially overlaps the detector response curve of the second diode.

These and other features and advantages of the invention will be apparent to those skilled in the art from the following detailed description of preferred embodiments, taken together with the accompanying drawings, in which:

BRIEF DESCRIPTION OF THE DRAWINGS

FIG. 1 is a perspective view of a $Ga_{1-x}Al_xAs$ diode made in accordance with the present invention.

FIG. 2 is a plot of the amount of Al present in the diode as a function of depth.

FIG. 4 is a diagram illustrating a wavelength matched emitter and detector system that utilizes the present LED.

FIG. 7 is a table that illustrates the atom fraction growth solution composition for different initial growth temperatures.

DETAILED DESCRIPTION OF THE INVENTION

Figure 3A:
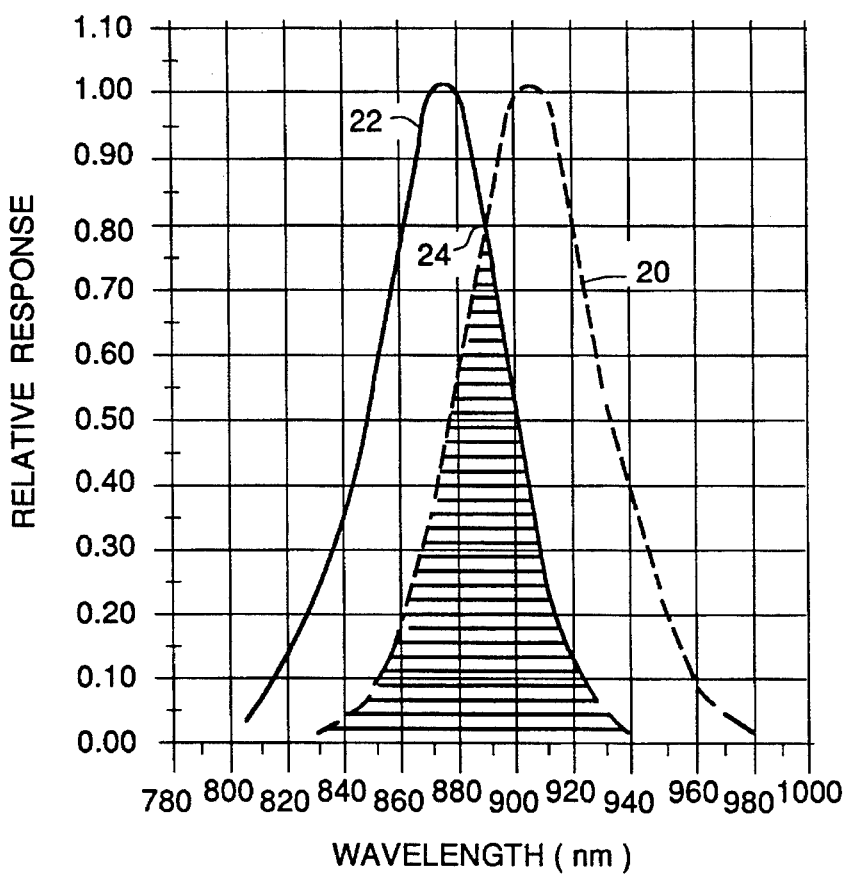
FIGS. 3a–3d are plots illustrating the diode emission and detector response curves for different initial growth temperatures.

FIG. 1a illustrates the graded-bandgap $Ga_{1-x}Al_xAs$ diode of the present invention. The diode is composed of n-type 10 and p-type 12 semiconductor material that form a p-n junction 14. Electrodes 15 are located on the top 16 and bottom 18 of the diode for applying a voltage across the diode (the bottom electrodes are not shown). The value of x in the $Ga_{1-x}Al_xAs$ composition (and therefore the amount of Al in the composition) is varied monotonically as the material is grown so that x decreases monotonically from a value greater than approximately 0.08 at the diode surface on the N side of the p-n junction 16 to a value not less than zero at the diode surface on the P side of the junction 18. The value of x at the p-n junction 14 should preferably be greater than zero and less than approximately 0.08.

To operate the diode as an emitter a forward bias voltage is applied across the electrodes so that a current is established across the electrodes. For a diode with dimensions of 0.61 mm×0.61 mm a typical current of 200 mA is established across the electrodes. To operate the diode as a detector, a reverse biased voltage is applied across the electrodes, preferably between 0 and 30 volts. Although light is emitted from all sides, the most efficient side is the n-side of the diode. In the preferred embodiment, light 19 is emitted or detected at the n-side of the diode.

The diode is preferably fabricated using a single layer liquid phase epitaxy (LPE) technique. A GaAs substrate is brought into contact with a melt solution of Ga, Al, As and Si. Si is an amphoteric dopant in $Ga_{1-x}Al_xAs$ grown from Ga rich solutions. At high temperatures Si substitutes in greater numbers on Ga and Al sites as a donor (n-type). At low temperatures, Si substitutes on As sites as an acceptor (p-type). The $Ga_{1-x}Al_xAs$ is grown on the GaAs substrate while the melt is gradually cooled through the transition temperature (the temperature at which Si switches from a donor dopant to an acceptor dopant), resulting in the formation of a p-n junction.

The graded bandgap structure arises as a result of a variation in the amount of Al as a function of depth (the value of x in the composition $Ga_{1-x}Al_xAs$). Since Al segregates strongly in favor of the solid state, the value of x decreases as growth of the epitaxial layer proceeds due to depletion of Al from the melt, as illustrated in FIG. 2. If the initial growth temperature is increased, less Al will be present at the p-n junction because more of the available Al will be depleted before the transition temperature is reached.

The Al gradient causes a corresponding gradient in the bandgap energy of the material, with $E_g$ decreasing as the amount of Al decreases. The gradient in $E_g$ means that the probability of self-absorption within the material is a function of the path traversed by the photon. Photons that travel toward the n-side of the material experience an increasing $E_g$ until they reach the n surface of the diode. This is the highest efficiency path for the photons. Therefore, in the preferred embodiment, the substrate is removed after growth so that the n-side of the material can be used as the emitter side.

Prior diodes fabricated with the above described method have been fabricated at initial growth temperatures of no higher than 920 degrees Celsius, resulting in an x value of approximately 0.08 or greater at the p-n junction. These prior diodes are not efficient emitters and detectors of light at a common wavelength. Their peak emission wavelength is significantly shifted from their peak detector response wavelength.

The present diode was fabricated as a result of the discovery that, as the initial growth temperature is increased, its peak emission wavelength approaches its peak detector response wavelength. At initial growth temperatures of 930 degrees Celsius and greater, the diode becomes an efficient emitter and detector of light at a common wavelength, as illustrated in FIGS. 3a–3c.

Figure 3B:
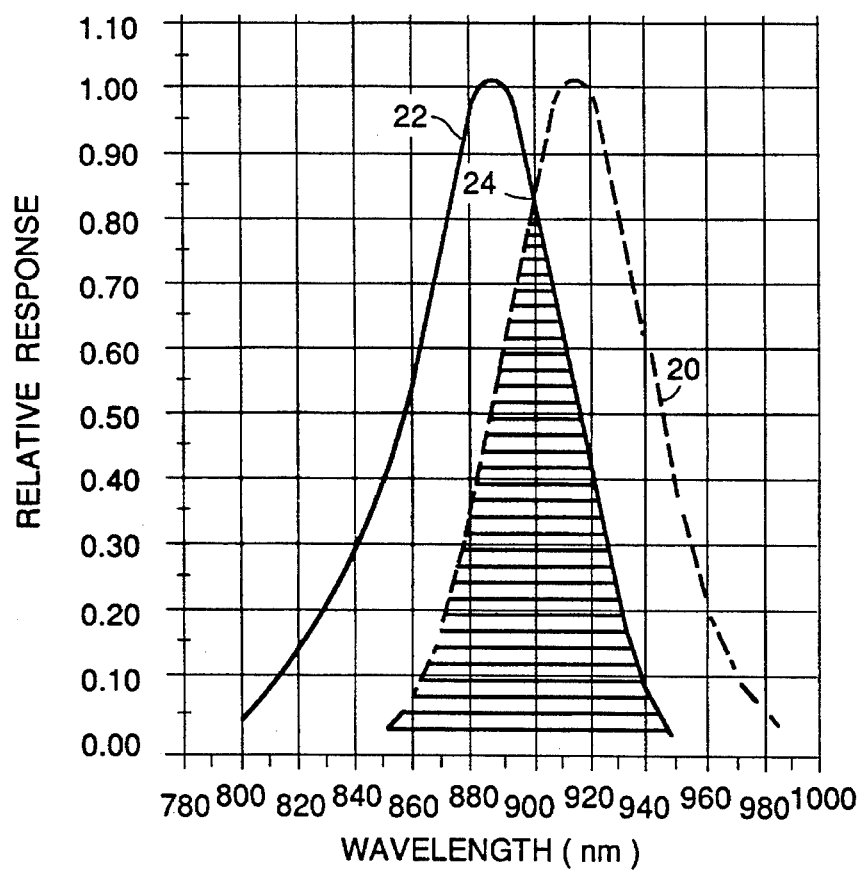
Figure 3C:
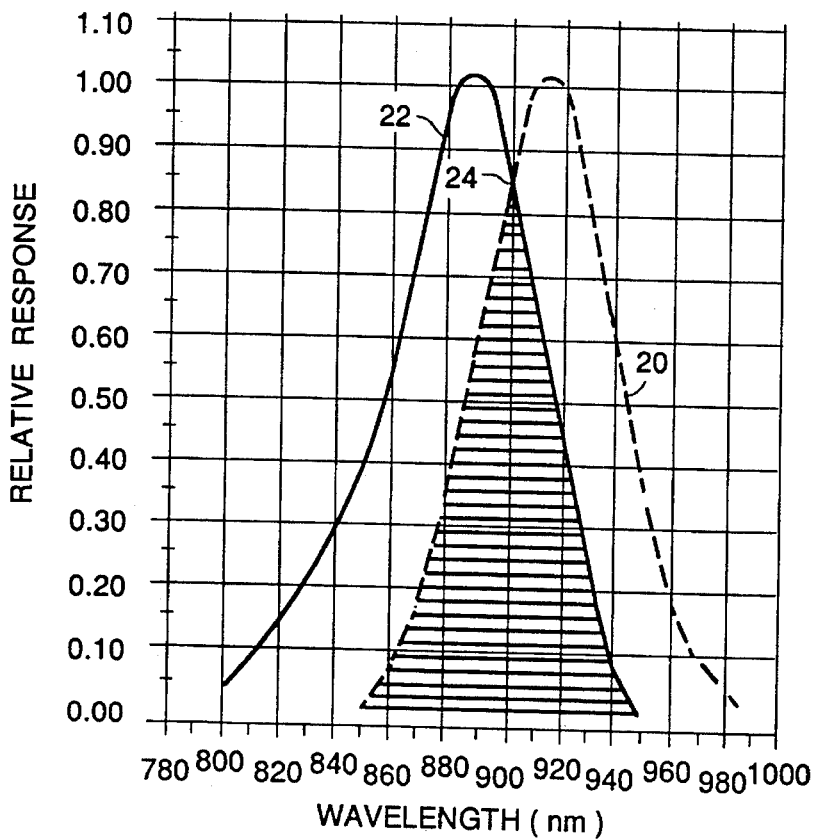
Figure 3D:
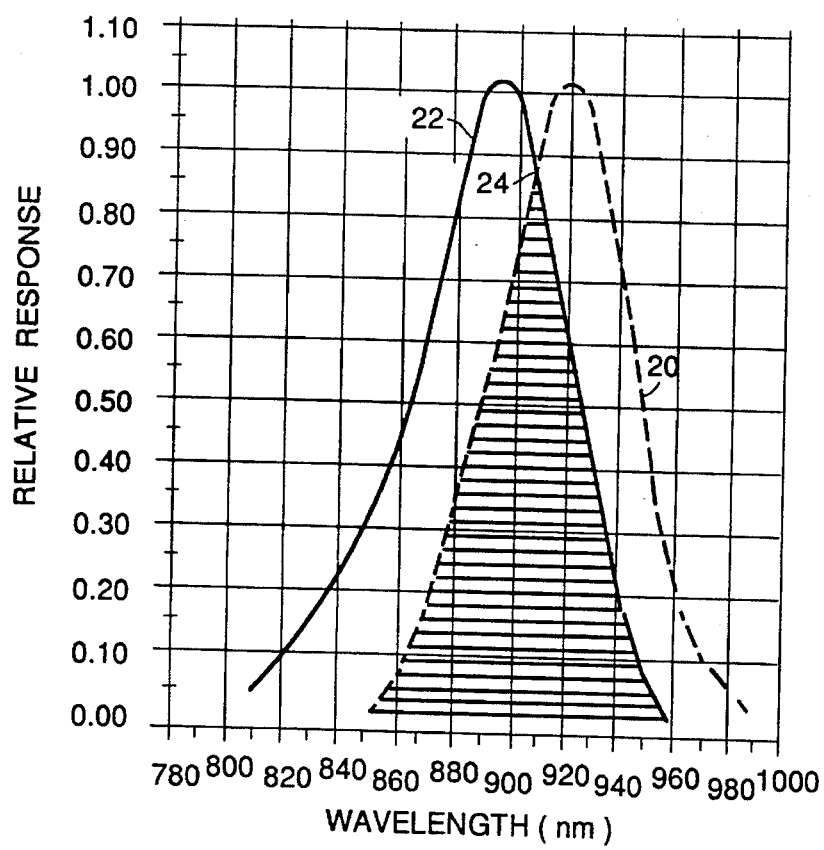
Figure 3E:
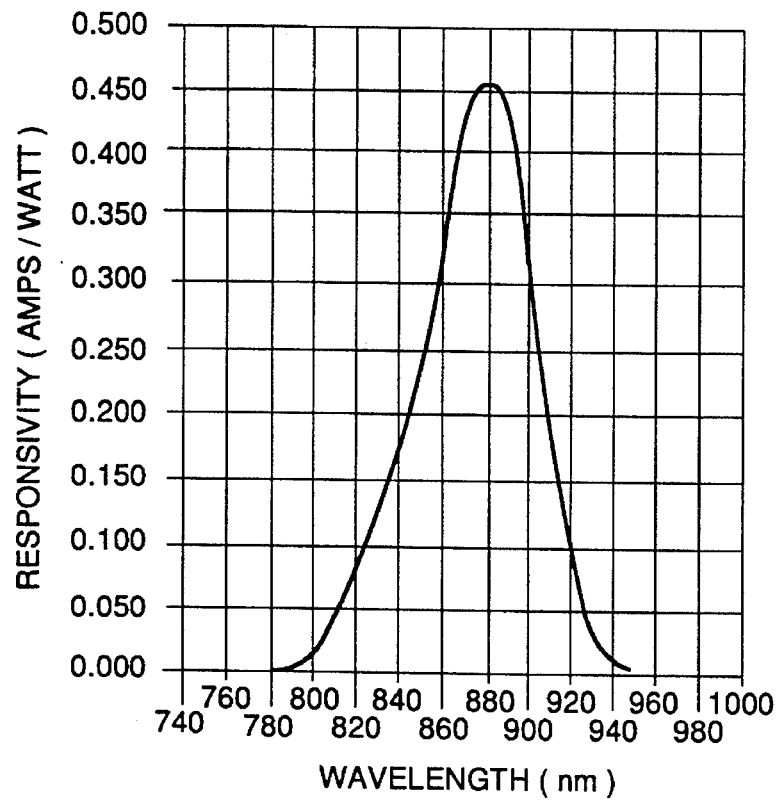
FIG. 3e is a plot of the absolute detector responsivity as a function of wavelength for a diode fabricated at an initial growth temperature of 940 degrees Celsius.

FIG. 3a is a graph illustrating the emission 20 and detector 22 responsivity curves (normalized with respect to their peak values) for a diode fabricated at an initial growth temperature of 930 degrees Celsius. The peak emission wavelength is shifted by approximately 30 nm with respect to the peak detector response wavelength. However, the curves are sufficiently close so that they substantial overlap, as illustrated by the shaded portions. At the peak overlap wavelength 24, the relative response of the diode is approximately 80% as a detector and as an emitter. At initial growth temperatures of 940, 950 and 960 degrees Celsius the relative response at the peak overlap wavelength increases to approximately 83%, 84% and 86%, respectively, because the detector response curve 22 shifts to longer wavelengths by a greater amount than the emission curve 20, as illustrated in FIGS. 3b, 3c and 3d. FIG. 3e illustrates the typical absolute detector responsivity for a diode fabricated at an initial growth temperature of approximately 940 degrees Celsius. The absolute responsivity is defined as the amount of electrical current (in Amps) generated by the diode for a given amount of input light (in Watts).

Figure 5:
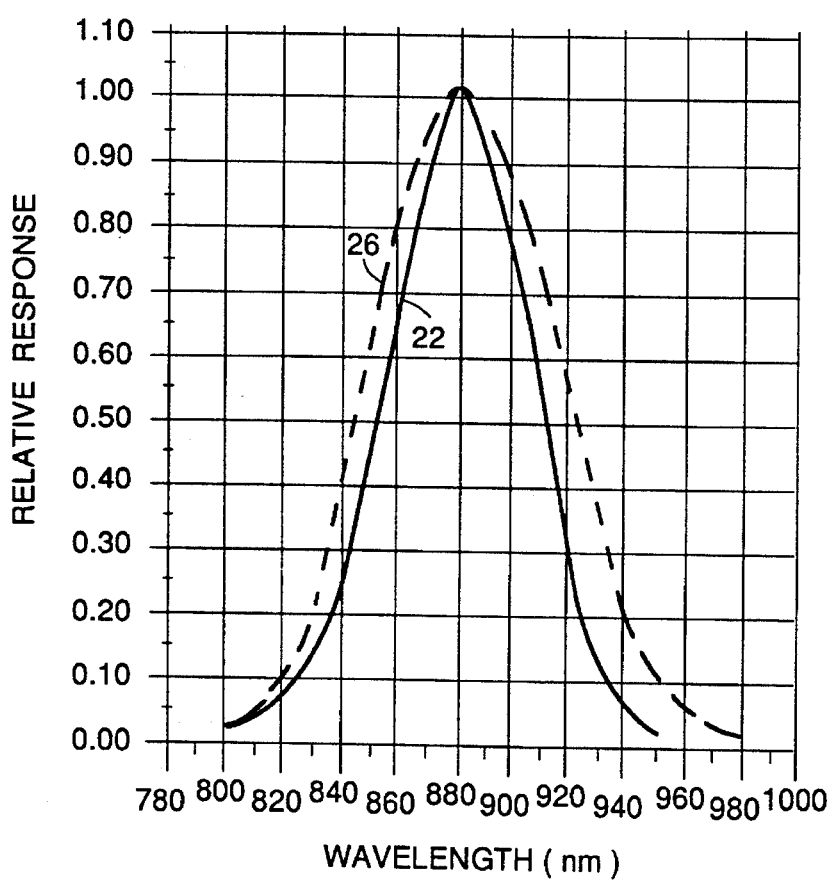
FIG. 5 is a plot illustrating the emission curve for an arbitrary conventional LED and the detector response curve for the present diode grown at an initial growth temperature of 940 degrees Celsius.

FIG. 4 is a diagram illustrating a wavelength matched emitter and detector system that utilizes the present LED. Two LEDs, $D_1$ and $D_2$, are forward biased and reversed biased, respectively, so that $D_1$ operates as an emitter of light 25 at a predetermined wavelength and $D_2$ operates as a detector of the same light 25. At least one of the LEDs is implemented with the LED of the present invention so that wavelength matching can be realized by adjusting that LED's initial growth temperature. For example, if the present diode is used as $D_2$ and a conventional diode is used as $D_1$, $D_2$'s initial growth temperature can be adjusted so that its detector response curve substantially overlaps the emission curve of $D_1$, whose peak emission wavelength is, for example, between approximately 860 and 900 nm. If $D_1$'s peak emission wavelength is approximately 883 nm, an initial growth temperature of approximately 940 degrees Celsius is used during fabrication of $D_2$, resulting in a detector response curve 22 ($D_2$'s response curve) that substantially overlaps the emission curve 26 of $D_1$, as illustrated in FIG. 5. Thus, the new diode ($D_2$) can be used to receive transmissions from $D_1$. Alternately, the present diode could be used as $D_1$ and any conventional diode (such as a silicon diode) could be used as $D_2$, so that the present diode transmits to a conventional diode that has a peak detection wavelength in the 860–900 nm range. In addition, $D_1$ and $D_2$ could both be implemented with the present diode and their initial growth temperatures adjusted so that their peak emission and detector wavelengths substantially overlap.

As mentioned above, the present diode is grown using a single layer LPE technique with a boat assembly that is commonly used for simultaneous epitaxial growth on multiple substrates. As illustrated in FIGS. 6a–6d, the boat assembly consists of alternating movable 28 and stationary 30 graphite plates. Each plate has machined depressions for accommodating GaAs substrates 32, and holes 33 that form the cavities for the growth solutions. The spacings of the depressions and holes in FIG. 6a create two large cavities 36 that are used to hold homogeneous liquid solutions.

Figure 6A:
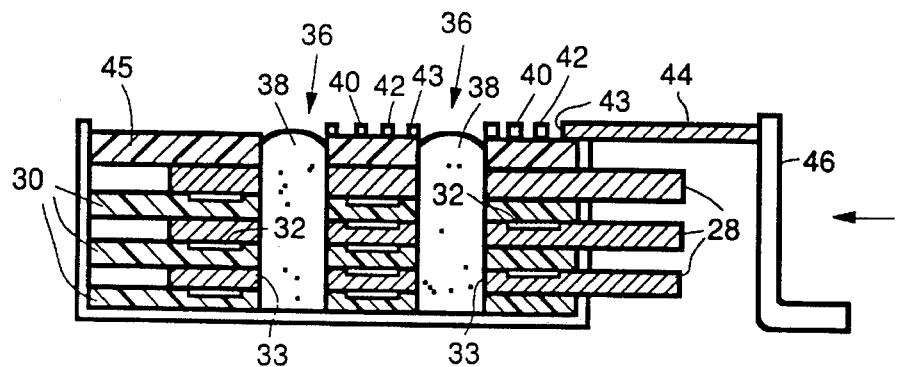
FIGS. 6a–6d are sectional views of the boat assembly used to grow the present diodes, taken at different steps in the LPE growth process.
Figure 6B:
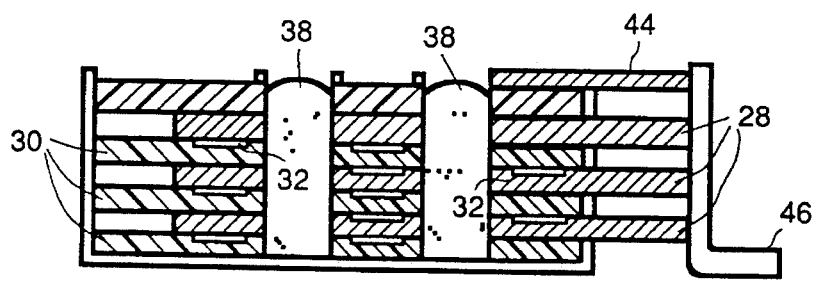

After the substrates 32 are loaded into the plates 28 and 30, the plates are alternately stacked as illustrated in FIG. 6a and the two large melt cavities 36 are loaded with Ga, Si and approximately 40% of the polycrystalline GaAs source material needed to bring the melt 38 to the desired liquid composition at the initial growth temperature. Al 40 and additional polycrystalline GaAs 42 are loaded into holes 43 on a top sliding plate 44, which does not carry a GaAs substrate. Plate 44 slides across a top stationary plate 45, which likewise does not carry a GaAs substrate.

The boat assembly is positioned inside a furnace (not shown) within a quartz tube (not shown). The quartz tube is evacuated and then filled with $H_2$. The furnace is then heated to approximately 575 degrees Celsius to remove oxygen from the solutions 38. After the oxygen is removed a pushrod 46, that is attached to the top sliding plate 44, is moved to the left to the position shown in FIG. 6b. This step slides the top plate 44 to move the holes 43 into alignment with the cavities 36, resulting in the addition of the Al 40 and additional GaAs 42 to the growth solutions 38. The furnace is heated to the initial growth temperature, for example 930 degrees Celsius, and held there for approximately 3 hours to permit the homogenization of the growth solutions 38. At this point in the growth procedure, the melt is still slightly deficient in As.

Figure 6C:
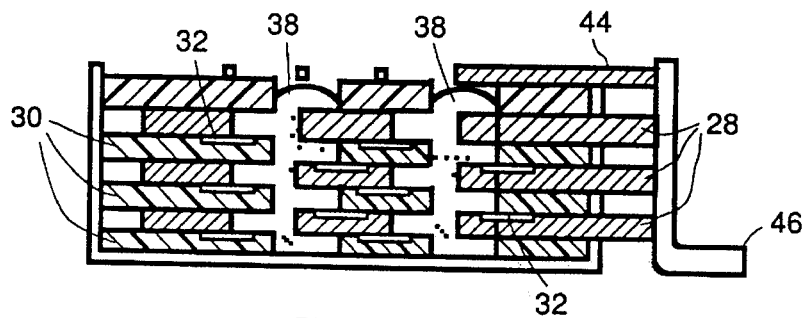
Figure 6D:
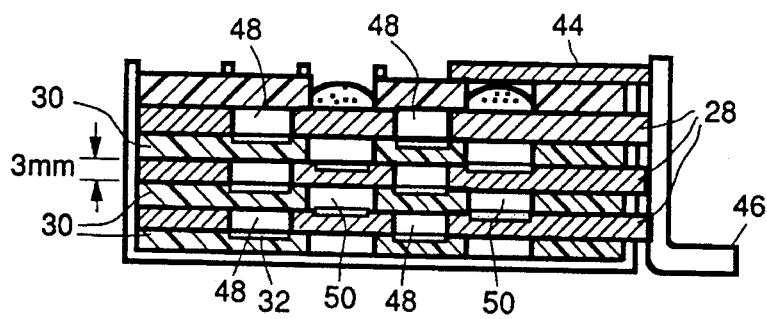

The pushrod 46 is then moved further to the left and comes into contact with the sliding plates 28. Further translation moves the sliding plates 28 and slices the growth solutions 38 into thin sections. Intermediate and final stages of this movement are illustrated in FIGS. 6c and 6d, respectively. As the plates 28 move to the left, the portions 48 of the growth solutions 38 located within their growth cavity openings are also moved to the left. With the plates 28 moved fully to the left, as shown in FIG. 6d, the growth solution portions 48 are positioned over the GaAs substrates 32 in the stationary plates 30, while the growth solution portions 50 between the moveable plates 28 remain in their original melt cavity positions and contact the GaAs substrates in the next lower moveable plate 28. The thickness of each individual portion or slice of growth solution is preferably equal to the thickness of the plates, which is typically approximately 3 mm.

The furnace is held at the initial growth temperature for approximately 30 minutes so that some GaAs is dissolved from the GaAs substrates 32. This supplies the growth solutions with the additional As needed to bring them to the desired liquid composition. For an initial growth temperature of 930 degrees Celsius, the atom fraction growth solution composition should preferably be: $X_{Ga}= 0.938$, $X_{As}=0.057$, $X_{Al}=0.0026$ and $X_{Si}= 0.0023$. The table of FIG. 7 provides the growth solution composition numbers for initial growth temperatures of 940, 950 and 960 degrees Celsius.

The epitaxial layer is grown by cooling the solutions from their initial temperatures to approximately 600 degrees Celsius at a rate of approximately 0.4 degrees Celsius per minute. When the solution temperature reaches approximately 600 degrees Celsius, the furnace is turned off and the solution is allowed to cool to a temperature that will allow handling of the diodes (room temperature). The solution is maintained in contact with the solid material during the entire cooling cycle.

In the preferred embodiment, the epitaxially grown material is removed from the underlying GaAs substrate so that the n-side of the material can be used as the emission and detection side. This is preferably done by using a "stop etch". The etch preferably consists of 30% $H_2O_2$ with a pH that is adjusted to 8.4 with the addition of $NH_4OH$. This etchant dissolves the GaAs at a rate of several microns per minute. For $Ga_{1-x}Al_xAs$ with x>0.2, the etch rate is approximately two orders of magnitude lower. As a result, the substrate can be etched unattended for several hours without risking the adjacent $Ga_{1-x}Al_xAs$ layer. After the substrate is removed, ohmic contacts are placed on the p-side and n-side by evaporating metal to each side. The epitaxial layer is then sawed into multiple square LEDs, typically 0.61 mm× 0.61 mm.

In the preferred embodiment, the LEDs are etched to remove saw damage and to improve their efficiency. The etching is preferably accomplished by placing the LEDs in an etching solution of concentrated $HNO_3$ for approximately 7 seconds.

Numerous other variations and alternate embodiments will occur to those skilled in the art without departing from the spirit and scope of the invention. Accordingly, it is intended that the invention be limited only in terms of the appended claims.

I claim:

1. A method of fabricating a light emitting diode capable of alternately functioning as an efficient emitter and detector of light at a common wavelength, comprising the steps of:

bringing a GaAs substrate into contact with a growth solution of Ga, As, Si and Al at an initial growth temperature of at least 930 degrees Celsius, cooling said growth solution through a transition temperature to grow a graded bandgap semiconductive structure on said substrate as a single epitaxial layer with the composition $Ga_{1-x}Al_xAs$, and with first and second semiconductive regions the form a p-n junction, and placing electrical contacts on said first and second conductive regions, the value of x in said semiconductive structure decreasing monotonically from a value greater than approximately 0.08 at the semiconductive structure surface on the n side of said junction to a value less than approximately 0.08 at said junction and to a still lower non-zero value at the semiconductive structure surface on the p side of said junction.

2. The LED fabrication method of claim 1, wherein said substrate is removed from said semiconductive structure after said structure is grown.

3. The LED fabrication method of claim 2, wherein said structure is placed in an etching solution for a period of time after said structure is grown.

4. The LED fabrication method of claim 3, wherein said etching solution comprises substantially pure $HNO_3$ and said structure is placed in said solution for approximately 7 seconds.

5. The LED fabrication method of claim 2, wherein said substrate is removed from said structure by etching said substrate with a 30 percent $H_2O_2$ solution having a pH of 8.4.

6. The method of claim 1, wherein said initial growth temperature is approximately 930 degrees Celsius and the liquid composition of said growth solution comprises approximately 93.8% Ga, 5.7% As, 2.6% Al and 2.3% Si.

7. The method of claim 1, wherein said initial growth temperature is approximately 940 degrees Celsius and the liquid composition of said growth solution comprises approximately 93.0% Ga, 6.5% As, 2.6% Al and 2.3% Si.

8. The method of claim 1, wherein said initial growth temperature is approximately 950 degrees Celsius and the liquid composition of said growth solution comprises approximately 92.4% Ga, 7.1% As, 2.5% Al and 2.3% Si.

9. The method of claim 1, wherein said initial growth temperature is approximately 960 degrees Celsius and the liquid composition of said growth solution comprises approximately 91.8% Ga, 7.8% As, 2.5% Al and 2.3% Si.

10. The LED fabrication method of claim 5, wherein said semiconductive structure is epitaxially grown by:

placing a crystalline GaAs substrate wafer in a growth vessel, placing in a melt cavity in said growth vessel, constituents which, when heated, form a melt solution, said constituents comprising Ga, Si and polycrystalline GaAs, the amount of said polycrystalline GaAs being less than that needed to bring said constituents to an initial liquid composition at an initial growth temperature, said melt cavity being out of contact with said substrate, heating said growth vessel in a pure $H_2$ atmosphere to approximately 575 degrees Celsius and maintaining said temperature until said melt solution is substantially depleted of oxygen, placing, in said melt cavity, Al and additional polycrystalline GaAs, heating said growth vessel to an initial growth temperature of at least 930 degrees Celsius and maintaining said temperature until said melt solution is substantially homogenized, bringing said substrate into contact with said melt solution and maintaining said initial growth temperature until enough GaAs dissolves from said wafer to bring said melt solution to said initial liquid composition, cooling said growth vessel at a rate of 0.4 degrees Celsius per minute until said temperature is approximately 600 degrees Celsius, and cooling said growth vessel to approximately room temperature.

11. The method of claim 10, wherein said initial growth temperature is approximately 930 degrees Celsius and said initial liquid composition comprises approximately 93.8% Ga, 5.7% As, 2.6% Al and 2.3% Si.

12. The method of claim 10, wherein said initial growth temperature is approximately 940 degrees Celsius and said initial liquid composition comprises approximately 93.0% Ga, 6.5% As, 2.6% Al and 2.3% Si.

13. The method of claim 10, wherein said initial growth temperature is approximately 950 degrees Celsius and said initial liquid composition comprises approximately 92.4% Ga, 7.1% As, 2.5% Al and 2.3% Si.

14. The method of claim 10, wherein said initial growth temperature is approximately 960 degrees Celsius and said initial liquid composition comprises approximately 91.8% Ga, 7.8% As, 2.5% Al and 2.3% Si.

* * * * *